(12) United States Patent
Pai

(10) Patent No.: US 6,740,967 B1
(45) Date of Patent: May 25, 2004

(54) IMAGE SENSOR HAVING AN IMPROVED PACKAGE STRUCTURE

(75) Inventor: Dennis Pai, Hsinchu Hsien (TW)

(73) Assignee: Kingpak Technology Inc., Hsinchu Hsien (TW)

( * ) Notice: Subject to any disclaimer, the term of this patent is extended or adjusted under 35 U.S.C. 154(b) by 0 days.

(21) Appl. No.: 10/386,069

(22) Filed: Mar. 10, 2003

(51) Int. Cl.[7] .............................................. H01L 23/12
(52) U.S. Cl. ...................... 257/704; 257/687; 257/678
(58) Field of Search ................................ 257/704, 687, 257/678

(56) References Cited

U.S. PATENT DOCUMENTS 6,262,479 B1 * 7/2001 Chou ........................ 257/704
6,459,149 B1 * 10/2002 Shimoe et al. ............. 257/704

* cited by examiner

Primary Examiner—Phat X. Cao
(74) Attorney, Agent, or Firm—Pro-Techtor International Services

(57) ABSTRACT

An image sensor includes a substrate, a coating layer, a frame layer, a photosensitive chip, multiple wires, and a transparent layer. The substrate has an upper surface formed with first terminals projecting over the upper surface, and a lower surface formed with second terminals. The coating layer is applied to the upper surface to fill between any two adjacent first terminals and to flatten the first terminals. The frame layer is adhered to the coating layer so as to form a cavity together with the substrate. The photosensitive chip has bonding pads and is mounted to the upper surface and within the cavity. The wires electrically connect the bonding pads to the first terminals, respectively. The transparent layer is arranged on the frame layer to cover the photosensitive chip so that the photosensitive chip may receive optical signals passing through the transparent layer.

4 Claims, 2 Drawing Sheets

IMAGE SENSOR HAVING AN IMPROVED PACKAGE STRUCTURE

BACKGROUND OF THE INVENTION

1. Field of the Invention

The invention relates to an image sensor having an improved package structure, and in particular to an image sensor that has a firm package structure and may be manufactured more conveniently.

2. Description of the Related Art

A general sensor is used to sense signals, which may be optical or audio signals. The sensor of the invention is used to receive image signals or optical signals. After receiving the image signals, the sensor converts the image signals into electrical signals, which are then transmitted to a printed circuit board via a substrate.

Referring to FIG. 1, a conventional image sensor includes a substrate 10, a frame layer 18, a photosensitive chip 26, a plurality of wires 28, and a transparent layer 34. The substrate 10 has an upper surface 12 on which first terminals 15 are formed, and a lower surface 14 on which second terminals 16 are formed. The frame layer 18 has a first surface 20 and a second surface 22 adhered to the upper surface 12 of the substrate 10 to form a cavity 24 together with the substrate 10. The photosensitive chip 26 is arranged within the cavity 24 and is mounted to the upper surface 12 of the substrate 10. Each wire 28 has a first terminal 30 and a second terminal 32. The first terminals 30 are electrically connected to the photosensitive chip 26, and the second terminals 32 are electrically connected to the first terminals 15 of the substrate 10. The transparent layer 34 is adhered to the first surface 20 of the frame layer 18.

As shown in FIG. 2, the first terminals 15 of the substrate 10 project over the upper surface 12 of the substrate 10, and a gap 29 is left between two adjacent first terminals 15. Therefore, when the frame layer 18 is adhered to the substrate by an adhesive, the product will be contaminated if the adhesive is not well controlled and flows out from the gaps. Furthermore, because of the gaps 29, the frame layer 18 may not be firmly adhered to the substrate 10 and may be easily damaged.

SUMMARY OF THE NVENTION

An object of the invention is to provide an image sensor having an improved package structure and improved product quality.

To achieve the above-mentioned object, the invention provides an image sensor including a substrate, a coating layer, a frame layer, a photosensitive chip, multiple wires, and a transparent layer. The substrate has an upper surface formed with first terminals projecting over the upper surface, and a lower surface formed with second terminals. The coating layer is applied to the upper surface to fill between any two adjacent first terminals and to flatten the first terminals. The frame layer is adhered to the coating layer so as to form a cavity together with the substrate. The photosensitive chip has bonding pads and is mounted to the upper surface and within the cavity. The wires electrically connect the bonding pads to the first terminals, respectively. The transparent layer is arranged on the frame layer to cover the photosensitive chip so that the photosensitive chip may receive optical signals passing through the transparent layer.

DETAILED DESCRIPTION OF THE INVENTION

Figure 1:
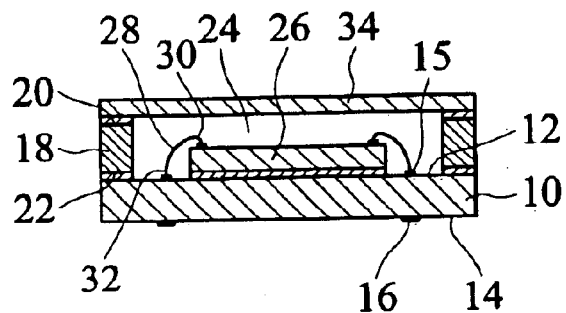
FIG. 1 is a cross-sectional view showing a conventional package structure of an image sensor.
Figure 2:
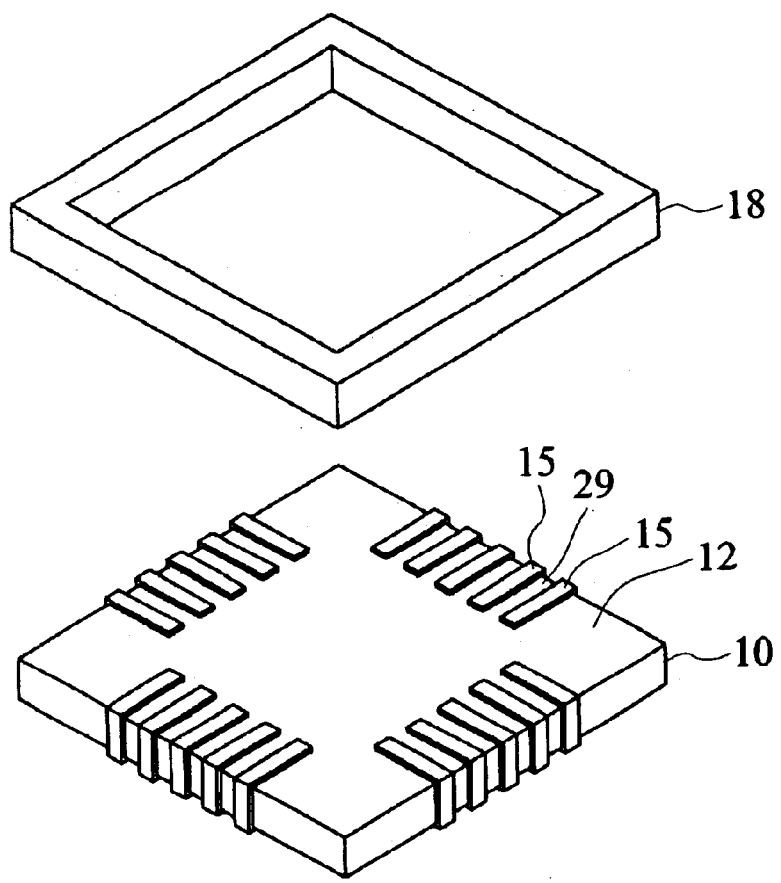
FIG. 2 is a pictorial view showing the conventional package structure of the image sensor.
Figure 3:
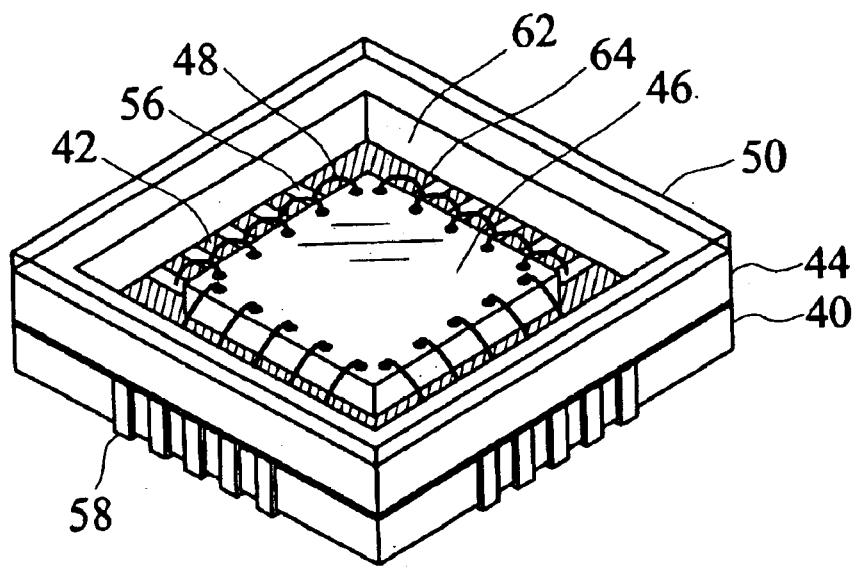
FIG. 3 is a pictorial view showing a package structure of an image sensor of the invention.
Figure 4:
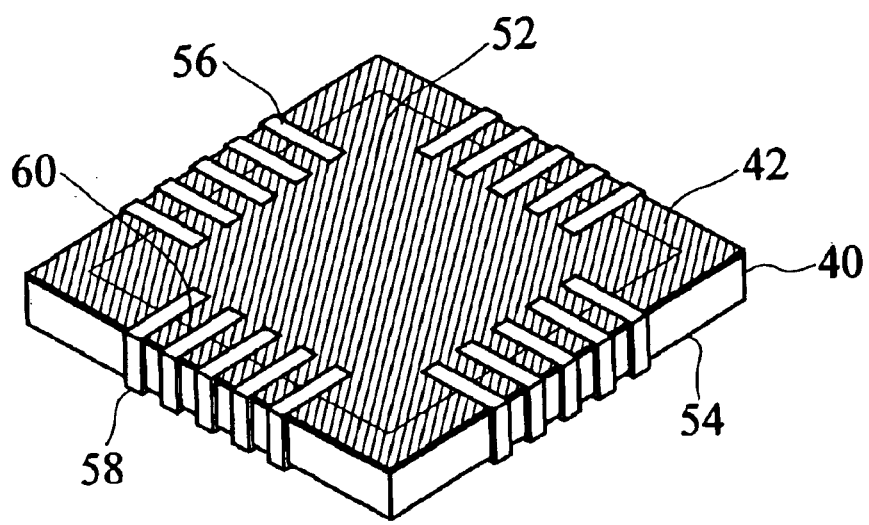
FIG. 4 is a pictorial view showing a substrate of the image sensor of the invention.

Referring to FIGS. 3 and 4, an image sensor of the invention includes a substrate 40, a coating layer 42, a frame layer 44, a photosensitive chip 46, a plurality of wires 48 and a transparent layer 50.

The substrate 40 has an upper surface 52 and a lower surface 54. The upper surface 52 is formed with a plurality of first terminals 56 projecting over the upper surface 52, and the lower surface 54 is formed with a plurality of second terminals 58. The first terminals 56 and the second terminals 58 are formed by applying a metallic material to the upper surface 52 of the substrate 40. Therefore, each first terminal 56 projects over the upper surface 52, and a gap 60 is left between two adjacent first terminals 56.

The coating layer 42 may be an insulating green paint applied to the gaps 60 between the first terminals 56 on the upper surface 52 of the substrate 40, thereby making the upper surface 52 to be a flat surface.

The frame layer 44 is adhered to the coating layer 42 of the upper surface 52 of the substrate 40 by way of, for example, die pressing. Then, the substrate 40 and the frame layer 44 form a cavity 62.

The photosensitive chip 46 has a plurality of bonding pads 64 and is mounted to the upper surface 52 of the substrate 40 and within the cavity 62.

The wires 48 electrically connect the bonding pads 64 of the photosensitive chip 46 to the first terminals 56 of the substrate 40, respectively.

The transparent layer 50 is arranged on the frame layer 44 to cover the photosensitive chip 46. Then, the photosensitive chip 46 may receive optical signals passing through the transparent layer 50.

Consequently, the frame layer 44 may be firmly mounted to the substrate 40 to facilitate the manufacturing process. In addition, it is possible to prevent the adhesive from overflowing.

While the invention has been described by way of an example and in terms of a preferred embodiment, it is to be understood that the invention is not limited to the disclosed embodiment. To the contrary, it is intended to cover various modifications. Therefore, the scope of the appended claims should be accorded the broadest interpretation so as to encompass all such modifications.

What is claimed is:

1. An image sensor, comprising:

a substrate having an upper surface formed with a plurality of first terminals projecting over the upper surface, and a lower surface formed with a plurality of second terminals;

a coating layer applied to the upper surface of the substrate to fill between any two adjacent first terminals and to flatten the first terminals on the upper surface;

a frame layer adhered to the coating layer on the upper surface of the substrate so as to form a cavity together with the substrate;

a photosensitive chip having a plurality of bonding pads, the photosensitive chip being mounted to the upper surface of the substrate and within the cavity;

a plurality of wires for electrically connecting the bonding pads of the photosensitive chip to the first terminals of the substrate, respectively; and a transparent layer arranged on the frame layer to cover the photosensitive chip so that the photosensitive chip may receive optical signals passing through the transparent layer.

2. The image sensor according to claim 1, wherein the coating layer is a green paint.

3. The image sensor according to claim 1, wherein the frame layer is mounted to the substrate by way of die pressing.

4. The image sensor according to claim 1, wherein the transparent layer is a piece of transparent glass.

* * * * *